United States Patent [19]

Neidig et al.

[11] Patent Number: 4,670,771

[45] Date of Patent: Jun. 2, 1987

[54] RECTIFIER MODULE

[75] Inventors: Arno Neidig, Plankstadt; Altan Akyürek, Heppenheim; Hubert Hettmann, Hockenheim, all of Fed. Rep. of Germany

[73] Assignee: Brown, Boveri & Cie AG, Mannheim, Fed. Rep. of Germany

[21] Appl. No.: 762,802

[22] Filed: Aug. 2, 1985

Related U.S. Application Data

[63] Continuation of Ser. No. 396,654, Jul. 9, 1982.

[30] Foreign Application Priority Data

Jul. 11, 1981 [DE] Fed. Rep. of Germany ....... 3127457

[51] Int. Cl.[4] .................. H01L 29/44; H01L 23/48; H01L 23/02
[52] U.S. Cl. .................. 357/74; 357/80; 357/81; 174/52 H; 174/52 S; 174/52 R; 174/52 PE; 361/386; 361/388; 361/389
[58] Field of Search .................. 357/74, 80, 81; 174/52 H, 52 S, 52 R, 52 PE; 361/386, 388, 389

[56] References Cited

U.S. PATENT DOCUMENTS

| | | | |
|---|---|---|---|
| 3,265,805 | 8/1966 | Carlan et al. | 174/52 H |
| 3,370,207 | 2/1968 | Fabel et al. | 357/74 |
| 3,475,662 | 10/1969 | Zido | 357/81 |
| 3,515,955 | 6/1970 | Butenshön | 357/74 |
| 3,829,598 | 8/1974 | Darnell | 357/72 |
| 3,994,430 | 11/1976 | Cusano et al. | 357/81 |
| 4,107,727 | 8/1978 | Ikezawa et al. | 357/81 |
| 4,117,508 | 9/1978 | Koenig | 357/81 |
| 4,249,034 | 2/1981 | Fichot et al. | 174/52 H |
| 4,436,951 | 3/1984 | Rief et al. | 174/52 PE |
| 4,514,587 | 4/1985 | Van Dyk Sorewyn | 357/74 |

Primary Examiner—Martin H. Edlow
Assistant Examiner—Jerome Jackson
Attorney, Agent, or Firm—Herbert L. Lerner; Laurence A. Greenberg

[57] ABSTRACT

Rectifier module, including a frame forming a housing wall and having an open top and bottom, a ceramic plate cemented to the frame forming a housing bottom and having a side facing the interior of the housing and a side facing away from the interior of the housing, metallizations disposed on the side of the ceramic plate facing the interior of the housing forming conductor strips for soldering on semiconductor components, internal connecting straps, external connecting elements in the form of flat plugs having a broadened base part being soldered to one of the metallizations, an actual plug connector part being freely accessible from the top of the housing and an extension curve being disposed between the base part and the actual plug connector, the extension curve having a cross-sectional area being smaller than the cross-sectional area of the base and actual plug connector parts, a sealing compound filling substantially half of the housing, and a copper foil being disposed on the side of the ceramic plate facing away from the interior of the housing and having a thickness being substantially the same as the thickness of the metallizations.

9 Claims, 2 Drawing Figures

RECTIFIER MODULE

This application is a continuation of application Ser. No. 396,654, filed July 9, 1982.

BACKGROUND OF THE INVENTION

1. Field of the Invention

The invention relates to a rectifier module with a frame being open at the top and bottom forming a housing wall, a ceramic plate cemented to the frame forming a housing bottom, the ceramic plate having metallizations on a side thereof facing the housing interior which serve as conductor strips to solder semiconductor components, internal connecting straps and external connecting elements, the connecting elements being in the form of flat plugs which are freely accessible from the upper surface of the housing and are soldered to a metallization in the housing, and roughly half the housing is filled with a sealing compound.

2. Description of the Prior Art

Such a rectifier module is known from the brochure "BBC Heavy Duty Rectifier Bridges" DHS 104981/29D. In such a device, thyristors and diodes are used in particular as semiconductor components. Fully controlled and semi-controlled single-phase bridges can be built by means of such rectifier modules.

When the rectifier module operates at normal load, heat losses will occur inside the module housing. This causes the soft silicon sealing compound in the housing interior to expand more than the metallic flat plugs connected to the ceramic plate, because the coefficient of expansion of the sealing compound is higher by approximately one order of magnitude, so that the flat plugs are subjected to strong, cyclic tensile stresses. The flat plugs are soldered to the substrate with soft solder. Soft solders, however, react sensitively to cyclic stresses, so that there exists the danger that after many alternating stress cycles, the internal electrical connection between the connecting element and the substrate will be broken.

In addition, the heat developing during the operation of the rectifier module causes the ceramic plate to be locally thermally stressed through the metallizations which are heating up on the side of the ceramic plate facing the housing interior. This dissipation must be carried away toward the heat sink through thermal resistances that are as low as possible. The provision of a potential-free metal base plate does not bring the success hoped for, because this metal base plate will tend to become concave toward the center of the plate due to the "bimetal effect" when soldering the ceramic substrate/metal plate of the system with an intermediate layer of solder. Despite adequate application of heat conducting paste, the danger of the inclusion of thin air layers remains, increasing the thermal resistance between the metal base plate and the heat sink.

To avoid the latter disadvantage, the metal base plate is omitted in one known solution to the problem so that the ceramic is in direct contact with the heat sink. While this construction has fewer heat transfer points, it has the disadvantage of allowing the ceramic plate to be easily damaged in handling the module. The consequence would be a loss of insulating capability.

Building on this premise, it is accordingly an object of the invention to provide a rectifier module which overcomes the herein-afore-mentioned disadvantages of the heretofore-known devices of this general type, and in which the thermal stresses occuring during operation cannot lead to a defect of the module.

SUMMARY OF THE INVENTION

With the foregoing and other objects in view there is provided, in accordance with the invention, a rectifier module, comprising a frame forming a housing wall and having an open top and bottom, a ceramic plate cemented to the frame forming a housing bottom and having a side facing the interior of the housing and a side facing away from the interior of the housing, metallizations disposed on the side of the ceramic plate facing the interior of the housing forming conductor strips for soldering on semiconductor components, internal connecting straps, external connecting elements in the form of flat plugs having a broadened solderable base part being soldered to one of the metallizations, an actual plug connector part being freely accessible from the top surface of the housing and an extension curve or expander being disposed between the base part and the actual plug connector, the extension curve having a cross-sectional area being smaller than the cross-sectional area of the base and actual plug connector parts, a sealing compound filling substantially half of the housing, and a copper foil being disposed on the side of the ceramic plate facing away from the interior of the housing and having a thickness being substantially the same as the thickness of the metallizations.

In accordance with a concomitant feature of the invention, the frame has a lower depression and a circular groove formed therein at the lower depression for cementing to the ceramic plate.

The advantages achievable with the invention are, in particular, that the rectifier module can be produced inexpensively and that good heat transfer to the heat sink is assured. By coating the ceramic plate with copper foil on its side facing away from the housing interior, thermal stresses caused by "bimetal effects" are avoided. Furthermore, the brittle and easily broken ceramic substrate is additionally protected, which means that in the presence of unevennesses of the heat sink and dust particles on the asembly surfaces, there is no danger of ceramic breakages, and therefore of the loss of insulating capability between the internal electrical connections of the rectifier module and the heat sink.

Other features which are considered as characteristic for the invention are set forth in the appended claims.

Although the invention is illustrated and described herein as embodied in a rectifier module, it is nevertheless not intended to be limited to the details shown, since various modifications and structural changes may be made therein without departing from the spirit of the invention and within the scope and range of equivalents of the claims.

BRIEF DESCRIPTION OF THE DRAWING

The construction and method of operation of the invention, however, together with additional objects and advantages thereof will be best understood from the following description of specific embodiments when read in connection with the accompanying drawings, in which.

DESCRIPTION OF THE PREFERRED EMBODIMENT

Figure 1:
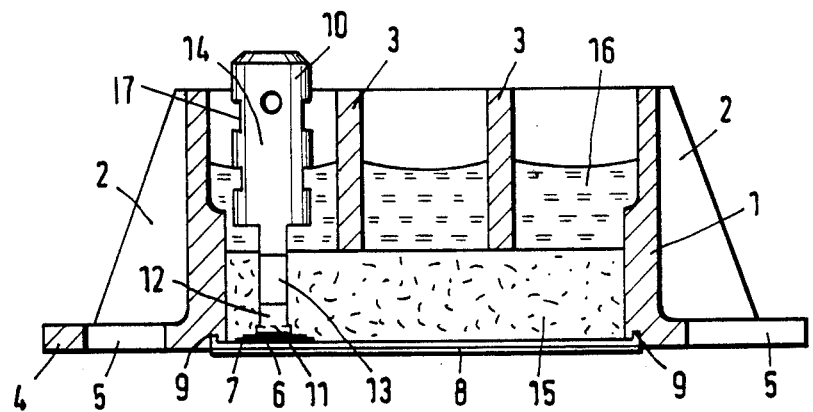
FIG. 1 is a diagrammatic, cross-sectional view of the wider side of a rectifier module.

Referring now to the figures of the drawing and first particularly to FIG. 1 thereof, there is shown a section of the broad side of the rectifier module according to an embodiment of the invention. The module has a frame 1 which is open at the top and bottom and serves as a housing wall. At both of its narrow sides, the frame 1 has bracing borders or ridges 2. For improved stability, the frame 1 also has several ribs 3 running parallel to the broad and narrow sides, respectively. In the rectifier module of the embodiment example, two ribs 3 extend parallel to the broad side and two ribs 3 extend parallel to external connecting elements for the module. The ribs 3 simultaneously serve as an insulation and leakage path extension between the external connecting elements. At both of its narrow sides, the frame 1 has mounting straps 4 at the level of the lower surface thereof. These mounting straps 4 have holes or U-shaped cutouts 5 for mounting the rectifier module to a heat sink.

The rectifier module housing is formed on one hand by the frame 1, and on the other hand by a ceramic plate 6 placed in a depression in the lower surface of the open frame 1. The ceramic plate 6 has metallizations 7 on its surface facing the housing interior. These metallizations 7 are formed, for example, of copper foil, applied directly to the ceramic without an intermediate layer, in accordance with a method known from U.S. patent application Ser. No. 561,124 filed Dec. 12, 1983. The metallizations 7 serve as conductor strips and contact surfaces for soldering connection elements, semiconductor components and internal connecting straps.

In order to mechanically stabilize the ceramic plate 6, a thick copper foil 8 is applied directly to the side of the ceramic plate 6 facing away from the housing interior, likewise in accordance with the method known from application Ser. No. 561,124. The thickness of the copper foil 8 roughly matches the thickness of the metallizations 7 (which are preferably also copper foils). This effectively prevents tensions resulting from manufacturing operations and unilateral soldering operations on the side of the ceramic plate 6 facing the housing interior. Furthermore, the copper foil 8 permits good thermal contact to a heat sink connected to the module. Additionally, the danger of ceramic breakages due to uneven or dirty heat sinks, such as because of dust particles, for example, is considerably reduced.

The frame 1 and the ceramic plate 6 are cemented to each other. In order to exactly fix the plate 6, the frame 1 has the above-mentioned circular depression on its lower surface, the depth of the depression roughly matching the thickness of the ceramic plate 6. A circular groove 9 provided at this depression in the frame 1 serves for receiving escaping adhesive. The excess adhesive travels into the groove 9 and does not flow over the edge of the ceramic plate 6 onto the cooling surface. A cooling surface of the ceramic plate 6 which has been marred by overflowing adhesive would have the disadvantage of needing to be additionally cleaned to remove residual adhesive. Otherwise, the heat transfer to the heat sink would be inhibited.

Figure 2:
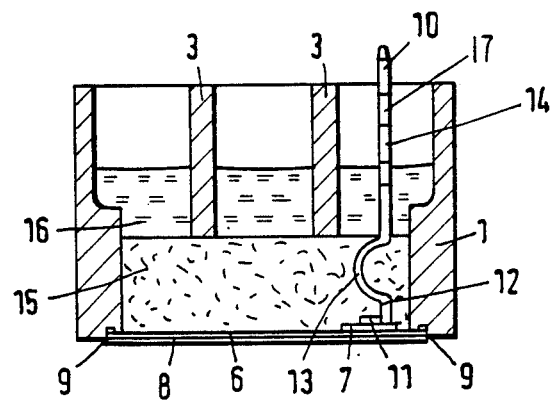
FIG. 2 is a cross-sectional view of the narrow side of the module of FIG. 1.

A flat plug 10 is soldered to the metallization 7 as a connecting element for an external plug contact. Only one flat plug is shown in FIGS. 1 and 2, but the module of the embodiment example can have a total of as many as nine such flat plugs. The flat plug 10 is freely accessible from the upper surface of the housing. The flat plug has a broadened base part 11 for the mechanical stabilization of the solder joint on the metallization 7. Adjacent the broadened base part 11 are an angle 12 and then an expander or extension curve 13. The shape of angle 12 and expander 13 is evident particularly from FIG. 2. At its upper end, the expander 12 merges into the actual plug contact 14 with notches 17. The cross-sectional area of the expander or extension curve 13 is smaller than the cross-sectional areas of the upper plug contact 14 and the lower base part 11. The expander 13 prevents high cyclic tensile stresses from acting upon the solder connection between the base part 11 and the metallization 7 of the ceramic plate 6.

The housing, to which the ceramic plate 6 is cemented, and which carries semiconductor components and flat plugs, is filled in the lower portion thereof with a soft sealing compound (e.g. silicone rubber) 15 for the protection of the active parts, and the expander 13 of the flat plug 10 should be embedded completely in the silicone rubber 15. A hard sealing compound 16 (e.g. epoxy resin) closes off the housing to a point just above the center of the housing. The hard sealing compound 16 especially mechanically stabilizes the flat plugs 10 at their notches 17.

In FIG. 2 there is shown a section of the narrow side of the rectifier module. The frame 1 with the ribs 3 and the circular groove 9 to receive the residual adhesive can be seen in part in FIG. 2. The ceramic plate 6 forming the housing bottom is coated on one side with the metallization 7, and on the other side with the copper foil 8. The base part 11 of the flat plug 10 is soldered to the metallization 7. The base part 11 merges through the angle 12 into the expander 13, which is connected to the actual plug contact 14. Also shown is the soft sealing compound 15 filling the lower part of the housing, and the hard sealing compound 16 filling the central housing part. The upper housing part remains free of sealing compounds for the external connection of the flat plugs.

The foregoing is a description corresponding to German Application No. P 31 27 457.9, dated July 11, 1981, the International priority of which is being claimed for the instant application, and which is hereby made part of this application. Any discrepancies between the foregoing specification and the aforementioned corresponding German application are to be resolved in favor of the latter.

We claim:

1. Rectifier module, comprising a frame forming a housing wall and having an open top and bottom and a depression formed in the bottom thereof, a ceramic plate, adhesive cementing said ceramic plate to said frame in said depression forming a housing bottom and having a side facing the interior of said housing and a side facing away from the interior of said housing, said frame including means for preventing said adhesive from escaping from said depression, said preventing means being a groove formed in said frame within said depression for receiving said adhesive, metallizations disposed on said side of said ceramic plate facing the interior of said housing forming conductor strips for soldering on semiconductor components, internal connecting straps connected to said frame, external connecting elements in the form of flat plugs having a broadened base part being soldered to one of said metallizations, an actual plug connector part being freely accessible from the top of said housing and an extension curve being disposed between said base part and said external plug connector, said extension curve having a cross-sectional area being smaller than the cross-sectional area of said base and actual plug connector parts, a sealing compound filling substantially half of said housing, and a thick copper foil being directly bonded to said side of said ceramic plate facing away from the interior of said housing and having a thickness being substantially the same as the thickness of said metallizations for preventing thermal tensions on the ceramic plate.

2. Rectifier module, comprising a housing forming a housing wall and having an open top and bottom and a depression formed in the bottom thereof, a ceramic plate, adhesive cementing said ceramic plate to said housing in said depression forming a housing bottom and having a side facing the interior of said housing and a side facing away from the interior of said housing, said housing including means for preventing said adhesive from escaping from said depression, said preventing means being a groove formed in said housing within said depression for receiving said adhesive, metallizations disposed on said side of said ceramic plate facing the interior of said housing forming conductor strips for soldering on semiconductor components, internal connecting straps connected to said housing, external connecting elements in the form of flat plugs having a broadened base part being soldered to one of said metallizations and an actual plug connector part being freely accessible from the top of said housing, a sealing compound filling substantially half of said housing, and a thick cooper foil being directly bonded to said side of said ceramic plate facing away from the interior of said housing and having a thickness being substantially the same as the thickness of said metallizations for preventing thermal tensions on the ceramic plate.

3. Rectifier module according to claim 2, wherein said external connecting elements include an extension curve being disposed between said base part and said actual plug connector, said extension curve having a cross-sectional area being smaller than the cross-sectional area of said base and actual plug connector parts.

4. Rectifier module according to claim 1, wherein said bonding is carried out by heating said ceramic plate covered with said copper foil in an oxygen-containing atmosphere to a temperature above the eutectic temperature of Cu and $Cu_2O$ but below the melting temperature of copper, in a vacuum furnace at pressure of not more than 1 mbar while maintaining a furnace atmosphere with a partial oxygen pressure between 0.0001 and 0.1 mbar.

5. Rectifier module according to claim 2, wherein said bonding is carried out by heating said ceramic plate covered with said cooper foil in an oxygen-containing atmosphere to a temperature above the eutectic temperature of Cu and $Cu_2O$ but below the melting temperature of copper, in a vacuum furnace at pressure of not more than 1 mbar while maintaining a furnace atmosphere with a partial oxygen pressure between 0.0001 and 0.1 mbar.

6. Rectifier module, comprising a frame forming a housing wall and having an open top and bottom and a depression formed in the bottom thereof, a ceramic plate, adhesive cementing said ceramic plate to said frame in said depression forming a housing bottom and having a side facing the interior of said housing and a side facing away from the interior of said housing, said frame including means for preventing said adhesive from escaping from said depression, said preventing means being a groove formed in said frame within said depression for receiving said adhesive, metallizations disposed on said side of said ceramic plate facing the interior of said housing forming conductor strips for soldering on semiconductor components, internal connecting straps connected to said frame, external connecting elements in the form of flat plugs having a broadened base part being soldered to one of said metallizations, an actual plug connector part being freely accessible from the top of said housing and an extension curve being disposed between said base part and said external plug connector, said extension curve having a cross-sectional area being smaller than the cross-sectional area of said base and actual plug connector parts, a sealing compound filling substantially half of said housing, and a copper foil having a thickness of at least 0.1 mm being directly bonded to said side of said ceramic plate facing away from the interior of said housing and having a thickness being substantially the same as the thickness of said metallizations for preventing thermal tensions on the ceramic plate.

7. Rectifier module, comprising a housing forming a housing wall and having an open top and bottom and a depression formed in the bottom thereof, a ceramic plate, adhesive cementing said ceramic plate to said housing in said depression forming a housing bottom and having a side facing the interior of said housing and a side facing away from the interior of said housing, said housing including means for preventing said adhesive from escaping from said depression, said preventing means being a groove formed in said housing within said depression for receiving said adhesive, metallizations disposed on said side of said ceramic plate facing the interior of said housing forming conductor strips for soldering on semiconductor components, internal connecting straps connected to said frame, external connecting elements in the form of flat plugs having a broadened base part being soldered to one of said metallizations and an actual plug connector part being freely accessible from the top of said housing, a sealing compound filling substantially half of said housing, and a cooper foil having a thickness of at least 0.1 mm being directly bonded to said side of said ceramic plate facing away from the interior of said housing and having a thickness being substantially the same as the thickness of said metallizations for preventing thermal tensions on the ceramic plate.

8. Rectifier module according to claim 1 wherein said thick copper foil has a thickness as high as 0.5 mm.

9. Rectifier module according to claim 2 wherein said copper foil has a thickness as high as 0.5 mm.

* * * * *